United States Patent
Song et al.

(10) Patent No.: US 8,659,010 B2
(45) Date of Patent: Feb. 25, 2014

(54) PHOTO LUMINESCENCE DIODE AND PHOTOLUMINESCENCE DIPLAY HAVING THE SAME

(75) Inventors: Hyung-Jun Song, Yongin (KR); Chang-Ho Lee, Yongin (KR); Il-Soo Oh, Yongin (KR); Hee-Joo Ko, Yongin (KR); Se-Jin Cho, Yongin (KR); Jin-Young Yun, Yongin (KR); Bo-Ra Lee, Yongin (KR); Young-Woo Song, Yongin (KR); Jong-Hyuk Lee, Yongin (KR); Sung-Chul Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 117 days.

(21) Appl. No.: 13/315,140

(22) Filed: Dec. 8, 2011

(65) Prior Publication Data
US 2013/0048953 A1 Feb. 28, 2013

(30) Foreign Application Priority Data
Aug. 30, 2011 (KR) .................. 10-2011-0087231

(51) Int. Cl.
 *H01L 29/08* (2006.01)
 *H01L 35/24* (2006.01)
 *H01L 51/00* (2006.01)

(52) U.S. Cl.
 USPC ........................................... 257/40

(58) Field of Classification Search
 USPC ................... 257/40, 642, 643, 759, 257/E51.001–E51.052, E25.008–E25.009, 257/13, 22, 84, 103, 184, 431, 432; 438/29, 438/69, 82, 99, 28; 250/214.1; 136/263, 136/246, 249, 252, 255, 256, 259
 See application file for complete search history.

(56) References Cited

U.S. PATENT DOCUMENTS

| | | | |
|---|---|---|---|
| 6,580,027 B2 * | 6/2003 | Forrest et al. | 136/263 |
| 7,358,538 B2 * | 4/2008 | Lu et al. | 257/97 |
| 2010/0301312 A1 * | 12/2010 | Jinde et al. | 257/40 |
| 2011/0198573 A1 * | 8/2011 | Iida et al. | 257/40 |
| 2012/0068983 A1 * | 3/2012 | Tsai et al. | 345/211 |
| 2012/0223875 A1 * | 9/2012 | Lau et al. | 345/83 |

FOREIGN PATENT DOCUMENTS

| | | |
|---|---|---|
| KR | 10-2006-0028385 | 3/2006 |
| KR | 10-2006-0035741 | 4/2006 |
| KR | 10-2006-0122334 | 11/2006 |
| KR | 10-0830976 | 5/2008 |
| KR | 10-2009-0061613 | 6/2009 |
| KR | 10-2009-0113607 | 11/2009 |
| KR | 10-2010-0039910 | 4/2010 |

OTHER PUBLICATIONS

U.Lemmer et al., A thesis entitled "Dynamics of photoexcitations in electric fields in poly(p-phenylenevinylene)diodes," in Synthetic Metals, 67 1994 pp. 169-172, in 1994.

* cited by examiner

*Primary Examiner* — Dao H Nguyen
*Assistant Examiner* — Tram H Nguyen
(74) *Attorney, Agent, or Firm* — Robert E. Bushnell, Esq.

(57) ABSTRACT

A photoluminescence diode which may decrease a driving voltage may include an anode, a cathode, an emission layer interposed between the anode and the cathode, and an electron accepting layer interposed between the emission layer and the cathode and including one material selected from fullerene, methanofullerene, doped fullerene, doped methanofullerene, a derivative thereof, and a mixture thereof.

25 Claims, 7 Drawing Sheets

PHOTO LUMINESCENCE DIODE AND PHOTOLUMINESCENCE DIPLAY HAVING THE SAME

CLAIM OF PRIORITY

This application makes reference to, incorporates the same herein, and claims all benefits accruing under 35 U.S.C. §119 from an application earlier filed in the Korean Intellectual Property Office on the 30 of Aug. 2011 and there duly assigned Serial No. 10-2011-0087231.

BACKGROUND OF THE INVENTION

1. Field of the Invention

The invention generally relates to a luminescence diode and a display device including the same, and more particularly, to a photoluminescence diode and a photoluminescence display device including the same.

2. Description of the Related Art

U. Lemmer et al. discloses an experimental photo luminescence quenching observation results of an ITO/PPV/Al structure in a thesis entitled "*Dynamics of photoexcitations in electric fields in poly(p-phenylenevinylene)diodes*," in Synthetic Metals, 67 1994, pp. 169-172, in 1994.

Korean Patent Laid-Open Publication No. 2010-0039910 discloses a photoluminescence display device using photoluminescent quenching. The photoluminescence display device disclosed in the Korean Patent Laid-Open Publication No. 2010-0039910 requires a driving voltage of about 20V or more. The driving voltage increases power consumption of the photoluminescence display device and reduces the lifespan of the photoluminescence diode.

SUMMARY OF THE INVENTION

An exemplary embodiment of this invention provides a photoluminescence diode that may decrease a driving voltage.

Another embodiment of this disclosure provides a photoluminescence display device including a photoluminescence diode that may decrease a driving voltage.

The photoluminescence diode may include an anode, a cathode, an emission layer interposed between the anode and the cathode, and an electron accepting layer that is interposed between the emission layer and the cathode and includes one material selected from fullerene, methanofullerene, doped fullerene, doped methanofullerene, a derivative thereof, and a mixture thereof.

The photoluminescence diode may further include an electron injection layer (EIL) formed of one selected from the group consisting of Li, Cs, Mg, LiF, CsF, $MgF_2$, NaF, KF, BaF2, $CaF_2$, $Li_2O$, BaO, $Cs_2CO_3$, $Cs_2O$, CaO, MgO, and lithium quinolate between the electron accepting layer and the cathode.

A thickness of the emission layer may be over 400 Å and not greater than 1000 Å.

The thickness of the emission layer may be over 500 Å.

A thickness of the electron accepting layer may be over 10 Å and not greater than 100 Å.

The total thickness of the electron accepting layer and the electron injection layer (EIL) may be greater than 20 Å and not greater than 200 Å.

A photoluminescence display device may include the photoluminescence diode; a P-type first transistor for transferring a voltage-level data signal in response to a present scan signal; a P-type second transistor for generating a driving current of the photoluminescence diode according to the voltage-level data signal transferred through the first transistor; and a pixel including a capacitor for storing the voltage-level data signal transferred to the second transistor; wherein a first terminal of the P-type second transistor is connected to the cathode of the photoluminescence diode, and a second terminal of the P-type second transistor is connected to a first power source, and the anode of the photoluminescence diode is connected to a second power source.

When the photoluminescence diode operates in a light excited quenching mode, a voltage level of the first power source may be higher than a voltage level of the second power source, and when the photoluminescence diode operates in an electric field excited mode, the voltage level of the first power source may be lower than the voltage level of the second power source.

A photoluminescence display device may include the photoluminescence diode; an N-type first transistor for transferring a voltage-level data signal in response to a present scan signal; an N-type second transistor for generating a driving current of the photoluminescence diode according to the voltage-level data signal transferred through the first transistor; and a pixel including a capacitor for storing the voltage-level data signal transferred to the second transistor; wherein a cathode of the photoluminescence diode is connected to a first power source, and a first terminal of the N-type second transistor is connected to an anode of the photoluminescence diode, and a second terminal of the N-type second transistor is connected to the second power source.

When the photoluminescence diode operates in a light excited quenching mode, the voltage level of the first power source may be higher than the voltage level of the second power source, and when the photoluminescence diode operates in an electric field excited mode, the voltage level of the first power source may be lower than the voltage level of the second power source.

A photoluminescence diode that may decrease a driving voltage may be provided. A photoluminescence display device including a photoluminescence diode that may decrease a driving voltage may be provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
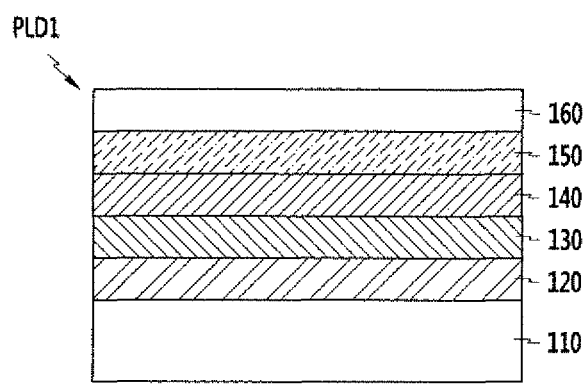
FIG. 1 is a cross-sectional view of a photoluminescence diode according to one embodiment of the invention.

Exemplary embodiments will hereinafter be described in further detail with reference to the accompanying drawings, in which various embodiments are shown. This disclosure may, however, be embodied in many different forms and should not be construed as limited to the exemplary embodiments set forth herein. These exemplary embodiments are provided to clearly illustrate this disclosure to those who have common knowledge in a related art. In short, this disclosure is defined by the scope of claims. Accordingly, well-known processes, structures and technologies are not specifically illustrated to avoid ambiguous interpretation of this disclosure in some exemplary embodiments. All the terms mentioned in the specification are easily understood by those who have common knowledge in a field related to this disclosure.

Also, the exemplary embodiments described in the present specification will be described by referring to cross-sectional views and/or schematic diagrams, which are ideal illustrations of this disclosure. Therefore, the shape of the illustration may be modified according to manufacturing technology and/or permissible error. Therefore, the exemplary embodiments of this disclosure are not restrictive but are illustrative only, and they may include a change in the shape according to a manufacturing process. Also, each constituent element of the drawings of this disclosure may be somewhat enlarged or reduced for better understanding and ease of description. Like reference numerals represent like constituent elements throughout the specification.

Hereinafter, referring to the drawings, exemplary embodiments are described.

Figure 2:
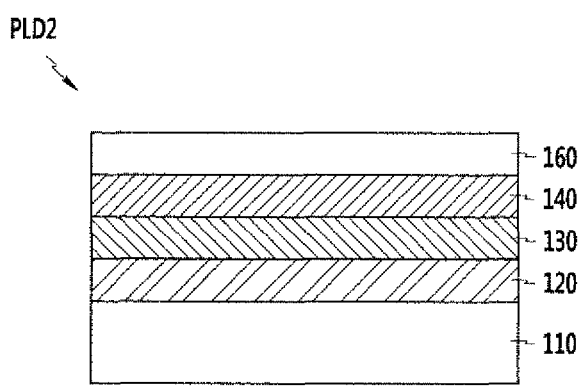
FIG. 2 is a cross-sectional view of a photoluminescence diode according to another embodiment of the invention.

FIGS. 1 and 2 are cross-sectional views of photoluminescence diodes according to first and second embodiments of the invention.

Referring to FIGS. 1 and 2, photoluminescence diodes PLD1 and PLD2 include an emission layer 130 between a pair of electrodes including an anode 110 and a cathode 160. A hole injection/transport layer 120 is interposed between the emission layer 130 and the anode 110. In the photoluminescence diode PLD1 according to the first embodiment, an electron accepting layer 140 and an electron injection layer (EIL) 150 are interposed between the emission layer 130 and the cathode 160. The electron accepting layer 140 is formed of one material selected from the group consisting of fullerene, methanofullerene, and a derivative thereof, while contacting the emission layer 130. The electron injection layer (EIL) 150 contacts the cathode 160. In the photoluminescence diode PLD2 according to the second embodiment, the electron accepting layer 140 is interposed between the emission layer 130 and the cathode 160. In other words, the formation of the electron injection layer (EIL) 150 may be omitted according to the required characteristics of the diode.

The anode 110 and the cathode 160 may be formed of a material that does not inject electrons and holes into the emission layer 130 when a reverse bias is applied to the photoluminescence diodes PLD1 and PLD2.

Also, the anode 110 may be formed of a material having excellent transmittance, low sheet resistance, and excellent manufacturing workability. For example, the anode 110 may be formed of a transparent conductive material such as ITO (indium tin oxide) and IZO (indium zinc oxide). Also, the anode 110 may further include a conductive reflective layer and another transparent conductive layer over the transparent conductive layer according to the light emitting direction of the photoluminescence diodes PLD1 and PLD2. The reflective layer improves the electrical conductivity while increasing luminous efficiency. For example, the reflective layer may be formed of aluminum (Al), aluminum alloy, silver (Ag), silver alloy, gold (Au) or gold alloy. The additional transparent conductive layer may be formed of ITO or IZO while suppressing the oxidation of the reflective layer.

Like the anode 110, the cathode 160 may be formed of a transparent conductive material, for example, indium tin oxide (ITO), indium zinc oxide (IZO), tin oxide ($SnO_2$), or zinc oxide (ZnO). In the meantime, the cathode 160 may be formed as a transparent or reflective metal thin film, for example, a thin film of lithium (Li), magnesium (Mg), aluminum (Al), aluminum-lithium (Al—Li), calcium (Ca), magnesium-indium (Mg—In), magnesium-silver (Mg—Ag), or calcium (Ca)-aluminum (Al), but the scope of this disclosure is not limited to them.

The hole injection/transport layer 120 efficiently transfers holes between the anode 110 and the emission layer 130. The hole injection/transport layer 120 may be formed of two separate layers of a hole injection layer (HIL) and a hole transport layer (HTL) or it may be formed of one integrated layer of a hole injection layer (HIL) and a hole transport layer (HTL). Non-limiting examples of the hole injection material include copper phthalocyanine (CuPc) or starburst-type amines. Non-limiting examples of the hole transport material may include 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N'-di(naphthalen-1-dyl)-N,N'-diphenyl benzidine (α-NPD), N,N'-diphenyl-N,N'-bis(1-naphthyl)-(1,1'-biphenyl)-4,4'-diamine (NPB), IDE320 (manufactured by IDEMITSU), poly(9,9-dioctylfluorene-co-N-(4-butylphenyl)diphenylamine) (poly (9,9-dioctylfluorene-co-N-(4-butylphenyl)diphenylamine) (TFB) or poly(9,9-dioctylfluorene-co-bis-N,N-phenyl-1,4-phenylenediamine(poly(9,9-dioctylfluorene-co-bis-(4-butylphenyl-bis-N,N-phenyl-1,4-phenylenediamin) (PFB), and the like.

The emission layer 130 may be formed of red (R), green (G) or blue (B) organic material. For example, when the emission layer 130 is formed of a red organic material, DCM1 (4-(dicyanomethylene)-2-methyl-6-(p-dimethylaminostyryl)-4H-pyran), DCM2 (2-methyl-6-[2-(2,3,6,7-tetrahydro-1H,5H-benzo[ij]quinolizin-9-yl)ethenyl]-4H-pyran- 4-ylidene]propane-dinitrile]), Eu(thenoyltrifluoroacetone)3 (Eu(TTA)3), or butyl-6-(1,1,7,7,-tetramethyljulolidyl-9-enyl)-4H-pyran (DCJTB) may be used. In the meantime, as the red organic material, Alq3 doped with a dopant DCJTB, or a material prepared by codepositing Alq3 and rubrene and doping the codeposition material with a dopant, may be used. As the red organic material, 4,4'-N—N'-dicarbazole-biphenyl (CBP) doped with a dopant BTPIr or Ir(piq)3 may be used, but the scope of this disclosure is not limited to it.

When the emission layer 130 is formed of a green organic material, coumarin 6, C545T, quinacridone, or Ir(ppy)3 may be used. Also, as a green organic material, CBP ([4,4'-Bis(carbazol-9-yl)biphenyl]) doped with a dopant Ir(ppy)3 may be used, and Alq3 doped with a coumarin-based dopant may be used, but the scope of this disclosure is not limited to them. Herein, as the coumarin-based dopant, C314S, C343S, C7, C7S, C6, C6S, C314T or C545T may be used.

Also, when the emission layer 130 is formed of a blue organic material, diverse materials, such as oxadiazole dimer dyes (Bis-DAPDXP), spiro compounds (Spiro-DPVBi and Spiro-6P), a triarylamine compound, bis(styryl)amines (DPVBi and DSA), a compound A, Flrpic, CzTT, anthracene, TPB, PPCP, DST, TPA, OXD-4, BBOT, AZM-Zn or BH-013X (Idemitsu Kosan), which is an aromatic hydrocarbon compound including naphthalene moiety, may be used. Also, as the blue organic material, IDE140 produced by Idemitsu (JP) doped with an IDE105 dopant, which is also produced by Idemitsu (JP), may be used, but the scope of this disclosure is not limited to it.

Also, the emission layer 130 may also be formed of a poly-phenylenevinylene (PPV)-based material or a polyfluorene-based material.

When a material that is an excellent photoluminescent material and electron light emitting material is selected as a material for forming the emission layer 130, the photoluminescence diodes PLD1 and PLD2 may operate in a dual mode. Non-limiting examples of the excellent photoluminescent material and electron light emitting material include Ir(piq)3 (red), Ir(ppy)3 (green), and Fir(pic) (blue).

To improve the photoluminescent luminance, the emission layer 130 may be thicker than the emission layer of a conventional organic luminescence diode (OLED). For example, while the emission layer of the conventional organic luminescence diode (OLED) is typically formed to have a thickness of about 100 Å to about 400 Å, the emission layer 130 of the photoluminescence diodes PLD1 and PLD2 according to an exemplary embodiment of the invention may have a thickness over 400 Å. According to one embodiment of the invention, the thickness of the emission layer 130 may be over 500 Å. For example, the thickness of the emission layer 130 may be greater than 500 Å and not greater than 1000 Å.

The electron accepting layer 140 is formed of a material selected from the group consisting of fullerene, methanofullerene, doped fullerene, doped methanofullerene, a derivative thereof, and a mixture thereof. Non-limiting examples of the doped fullerene or methanofullerene include fullerene or methanofullerene doped with an organic N-type impurity. Non-limiting examples of the organic N-type impurity include pyronine B or dicarbocyanine iodide. Non-limiting examples of the fullerene or methanofullerene derivative include a methanofullerene having an ethyleneoxy group that is disclosed in Korean Patent Laid-Open Publication No. 2009-0113607 or a methanofullerene substituted with a fluorine group that is disclosed in Korean Patent Laid-Open Publication No. 2009-0061613.

The thickness of the electron accepting layer 140 may be greater than 10 Å and not greater than 100 Å. The electron accepting layer 140 may effectively serve as an electron implanter when the electron accepting layer 140 has a thickness over 10 Å, and the electron accepting layer 140 may suppress a driving voltage from rising when the electron accepting layer 140 has a thickness not greater than 100 Å. Particularly, when there is the electron accepting layer 140 alone, the tunneling of electrons has to be possible. Therefore, a thickness of the electron accepting layer 140 may be greater than 10 Å and not greater than 50 Å.

The electron injection layer (EIL) 150 may be formed of Li, Cs, Mg, LiF, CsF, $MgF_2$, NaF, KF, $BaF_2$, CaF2, $Li_2O$, BaO, $Cs_2CO_3$, $Cs_2O$, CaO, MgO or lithium quinolate.

A thickness of the electron injection layer (EIL) 150 may be greater than 10 Å and not greater than 100 Å. The electron accepting layer 140 may effectively serve as an electron implanter when the electron accepting layer 140 has a thickness over 10 Å, and the electron accepting layer 140 may suppress a driving voltage from rising when the electron accepting layer 140 has a thickness not greater than 100 Å.

Meanwhile, the total thickness of the electron injection layer (EIL) 150 and the electron accepting layer 140 may be greater than 20 Å and not greater than 200 Å. When the total thickness is over 20 Å, electron implantation may be performed effectively, and when the total thickness is not greater than 200 Å, the driving voltage may be suppressed from rising.

FIG. 3A to FIG. 3D are schematic diagrams illustrating a principle that a photoluminescence diode emits light and a principle that a photoluminescence diode has a decreasing driving voltage when the photoluminescence diode operates in a light excited quenching mode in accordance with an exemplary embodiment of the invention.

Figure 3A:
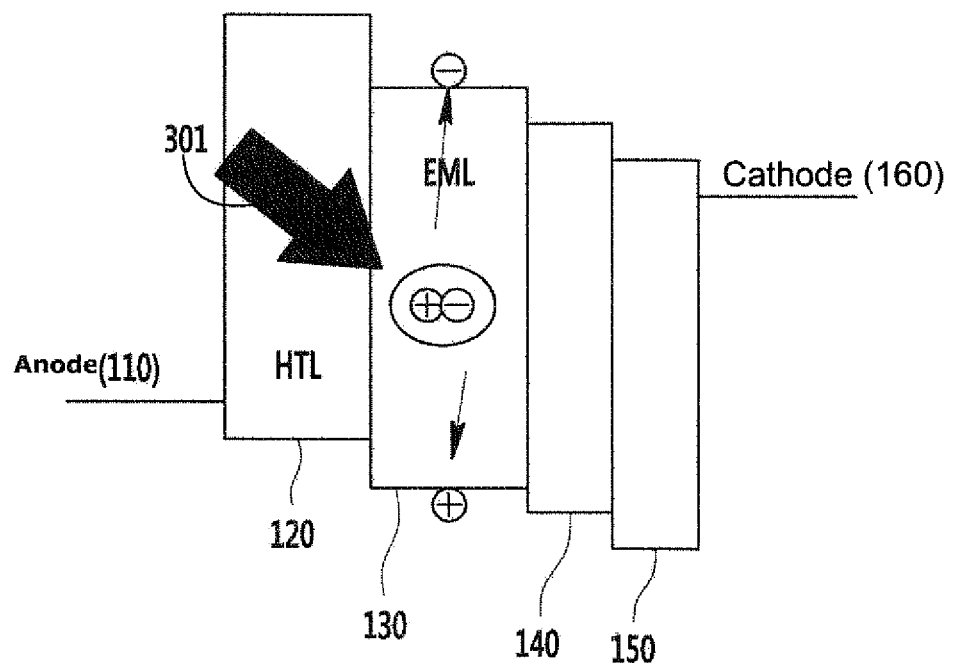
FIGS. 3A to FIG. 3D are schematic diagrams illustrating a principle that a photoluminescence diode emits light and a principle that a photoluminescence diode has a decreasing driving voltage when the photoluminescence diode operates in a light excited quenching mode in accordance with an exemplary embodiment of the invention.

FIG. 3A shows a step of providing an external light 301. When the external light 301 is applied as an exciting source to the emission layer 130, excited excitions are produced by the external light 301 and the excitons are separated into electrons and holes. The external light 301 may be natural light or an artificial illumination.

Figure 3B:
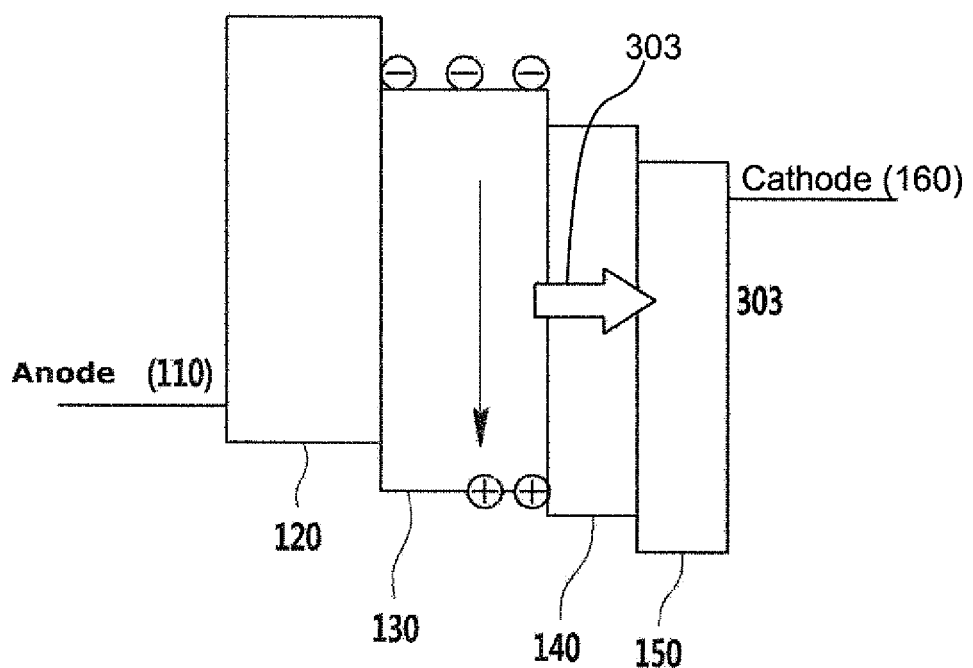

FIG. 3B shows a photoluminescent step. When no bias is applied, electrons separated from the excitons go back to their original equilibrium state, emitting the absorbed energy in the form of light 303.

Figure 3C:
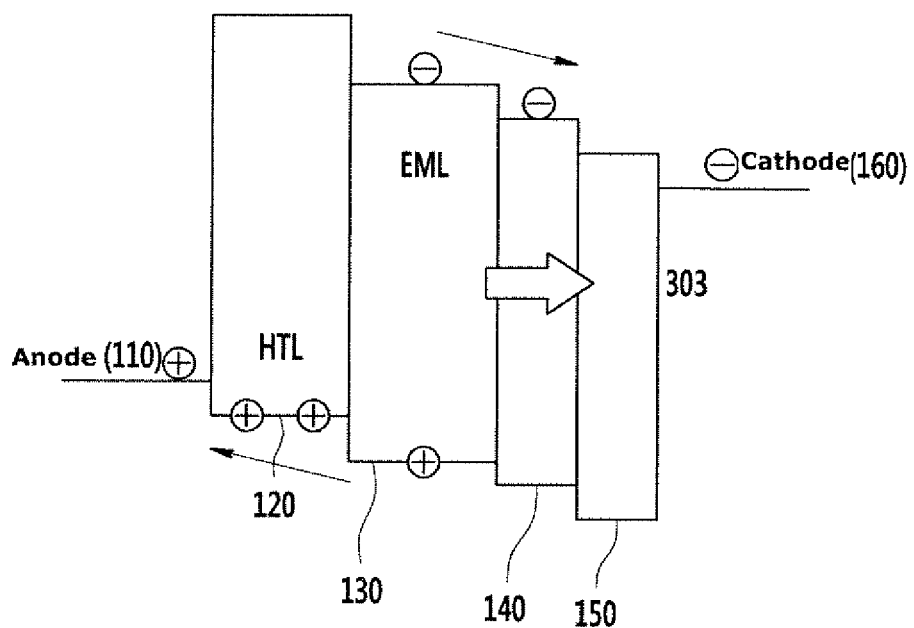

FIG. 3C shows a quenching process. When a reverse bias is applied, the separated holes and electrons are conducted to the anode 110 and the cathode 160, respectively, and quenched. Therefore, as the reverse bias increases, the photoluminescence diode PLD1 becomes darker.

Figure 3D:
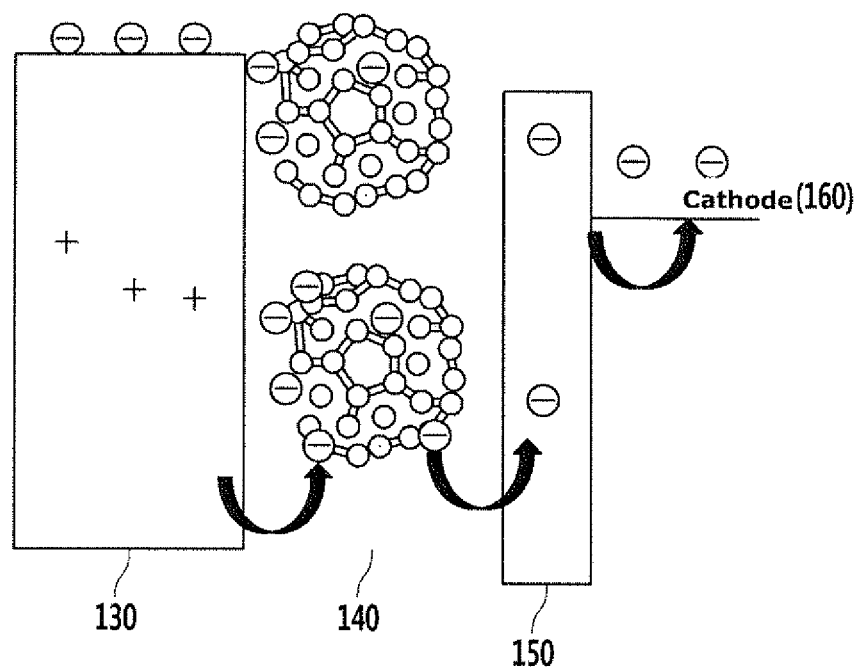

FIG. 3D is a schematic diagram illustrating how the electron accepting layer 140 reduces a driving voltage during the quenching process. As described above with reference to FIG. 3C, when the reverse bias is applied, the separated electrons are conducted to the cathode 160 and quenched. Herein, the electron accepting layer 140 disposed between the emission layer 130 and the cathode 160 facilitates the efficient transfer of electrons from the emission layer 130 to the cathode 160. As a result, although the reverse bias voltage needed for quenching, that is, a driving voltage, is low, the quenching may occur effectively compared with a conventional photoluminescence diode. As described above, the photoluminescence diode PLD1 comes to have a normally white structure when it operates in a light excited quenching mode.

Figure 4A:
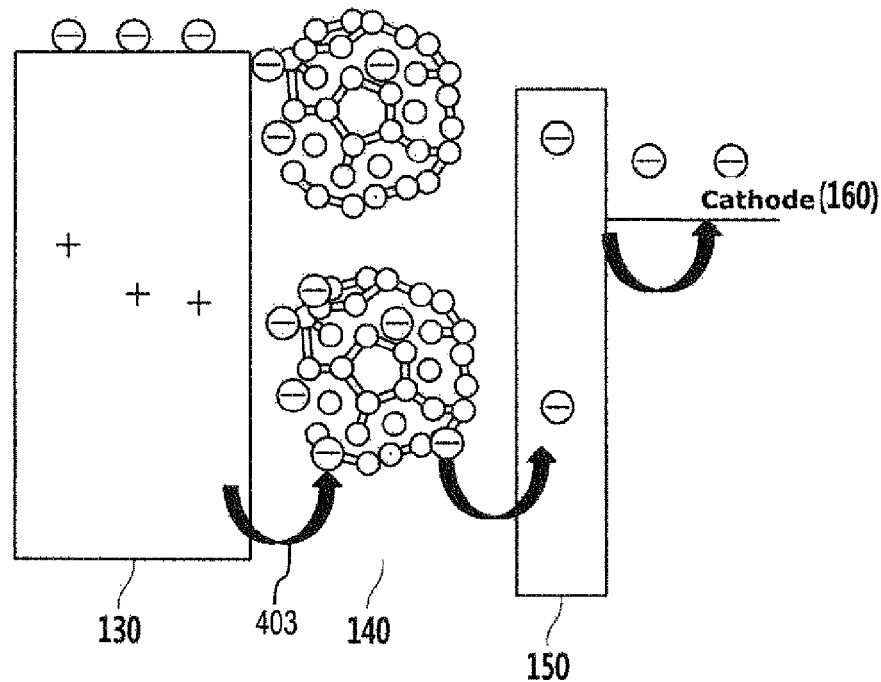
FIG. 4A to FIG. 4B are schematic diagrams illustrating a principle that a photoluminescence diode emits light and a principle that a photoluminescence diode has a decreasing driving voltage when the photoluminescence diode operates in an electric field excited mode in accordance with an exemplary embodiment of the invention.
Figure 4B:
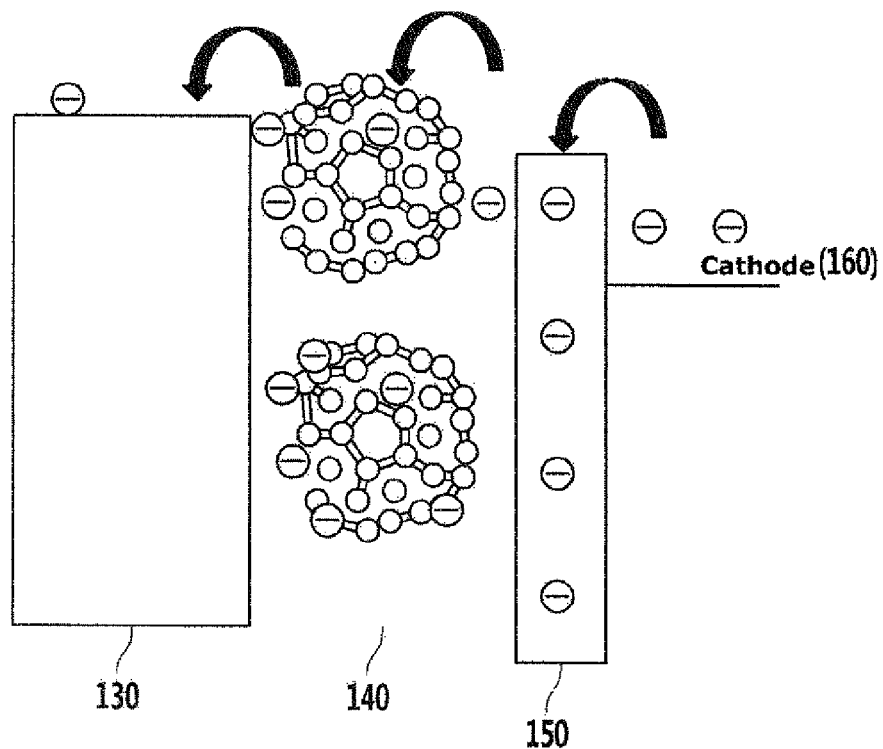

FIG. 4A to FIG. 4B are schematic diagrams illustrating a principle that a photoluminescence diode emits light and a principle that a photoluminescence diode has a decreasing driving voltage when the photoluminescence diode operates in an electric field excited mode in accordance with an exemplary embodiment of the invention.

When a material which is an excellent photoluminescent material and electron light emitting material is selected as a material for forming the emission layer 130, dual mode display may be possible. In a bright condition that there is an external light, it may operate in a light excited quenching mode, and in a less bright condition without an external light, it may operate in an electric field excited mode. In short, if there is no external light, as illustrated in FIG. 4A, when a forward bias is applied to the photoluminescence diode PLD1, the electrons and the holes are combined with each other in the emission layer 130, emitting light 403. FIG. 4B is a schematic diagram illustrating how the electron accepting layer 140 decreases a driving voltage during light emitting in the electric field excited mode. When forward bias is applied, electrons are transferred from the cathode 160 to the emission layer 130. Herein, the electron accepting layer 160 disposed between the emission layer 130 and the cathode 160 facilitates efficient transfer of the electrons from the cathode 160 to the emission layer 130. As a result, although the forward bias voltage needed for the light emitting, that is, a light emitting voltage, is low, the light emission may occur effectively. As described above, when the photoluminescence diode PLD1 operates in the electric field excited mode, the photoluminescence diode PLD1 has a normally black structure.

Figure 5:
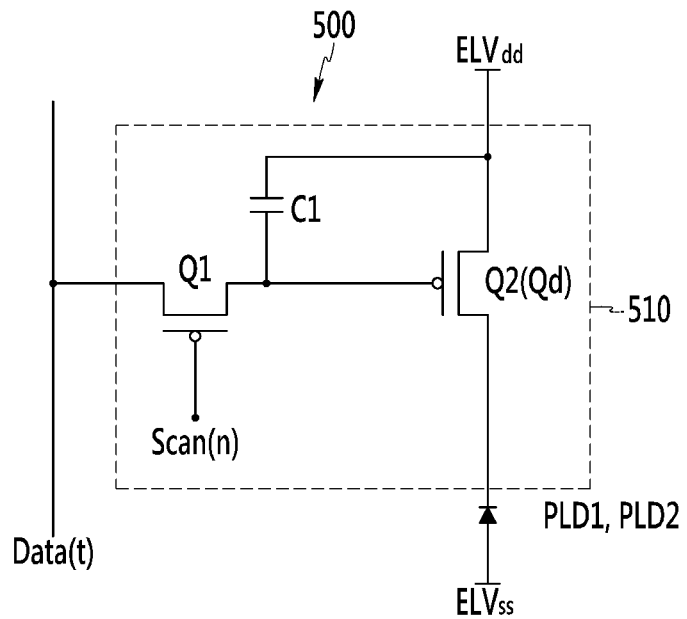
FIG. 5 is an equivalent circuit diagram of a display device pixel including photoluminescence diodes in accordance with exemplary embodiments of the invention.

FIG. 5 is an equivalent circuit diagram of a display device pixel including photoluminescence diodes in accordance with exemplary embodiments of the invention.

Each display device pixel 500 includes the photoluminescence diodes PLD1, PLD2 and a pixel circuit 510 of a two-transistor-one-capacitor (2T1C) structure.

A gate of a first transistor Q1 is connected to a scan signal (Scan[n]), and a first terminal of the first transistor Q1 is connected to a data signal (Data[t]) while a second terminal of the first transistor Q1 is connected to a gate of a second transistor Q2 and a first terminal of a capacitor C1.

The gate of the second transistor Q2, which is a driving transistor, is connected to the first terminal of the capacitor C1 and to the second terminal of the first transistor Q1, while the first terminal of the second transistor Q2 is connected to the cathodes of the photoluminescence diodes PLD1, PLD2 and the second terminal of the second transistor Q2 is connected to the first power source (ELVdd).

The first terminal of the capacitor C is connected to the second terminal of the first transistor Q1 and to the gate of the second transistor Q2, and the second terminal of the capacitor C1 is connected to the first power source (ELVdd).

The cathodes of the photoluminescence diodes PLD1, PLD2 are connected to the first terminal of the second (driving) transistor Q2, and the anodes of the photoluminescence diodes PLD1, PLD2 are connected to the second power source (ELVss).

The first transistor Q1 is a switching transistor that transfers a data signal (Data[t]) of a voltage level which is applied to a corresponding data line in response to a present scan signal (Scan[n]).

The second transistor Q2 is a driving transistor that provides the photoluminescence diodes PLD1, PLD2 with a driving current according to the data signal (Data[t]) of a voltage level inputted to the gate through the first transistor Q1.

The capacitor C1 is a capacitor for storing a data signal applied to the gate of the second (driving) transistor Q2.

The first (switching) transistor Q1 and the second (driving) transistor Q2 are P-channel field effect transistors.

The cathode terminals of the photoluminescence diodes PLD1, PLD2 are electrically connected to the first terminal of the second (driving) transistor Q2. Herein, the words "electrically connected" not only simply mean that the cathode terminals of the photoluminescence diodes PLD1, PLD2 are directly connected to the first terminal of the second (driving) transistor Q2, as illustrated in FIG. 5, but also mean that, even if there is another transistor between the cathode terminals of the photoluminescence diodes PLD1, PLD2 and the first terminal of the second (driving) transistor Q2, a current may flow between the cathode terminals of the photoluminescence diodes PLD1, PLD2 and the first terminal of the second (driving) transistor Q2 by the operation of the other transistor.

With the pixel circuit 510 shown in FIG. 5, the capacitor C1 applies a voltage corresponding to the data voltage (Data[t]) to the gate of the second (driving) transistor Q2, and the second (driving) transistor Q2 supplies a current corresponding to the voltage between a gate and a source to the photoluminescence diodes PLD1, PLD2.

With the pixel 500 illustrated in FIG. 5, the swing range of the gate voltage of the second (driving) transistor Q2 needed for the operation of the light excited quenching mode may be reduced, compared with a conventional pixel structure where the anodes of the photoluminescence diodes PLD1, PLD2 are connected to the output terminal of the second (driving) transistor Q2. Furthermore, since the structure of the pixel 500 shown in FIG. 5 may operate in the light excited quenching mode or the electric field excited mode according to the current supplied to the photoluminescence diodes PLD1, PLD2, it may be easily applied to a dual mode display device. During an operation in the light excited quenching mode, the voltage level of the first power source is caused to be higher than the voltage level of the second power source so that a reverse bias is applied to the photoluminescence diodes PLD1, PLD2. Conversely, during an operation in the electric field excited mode, the voltage level of the first power source is caused to be lower than the voltage level of the second power source so that a forward bias is applied to the photoluminescence diodes PLD1, PLD2.

Figure 6:
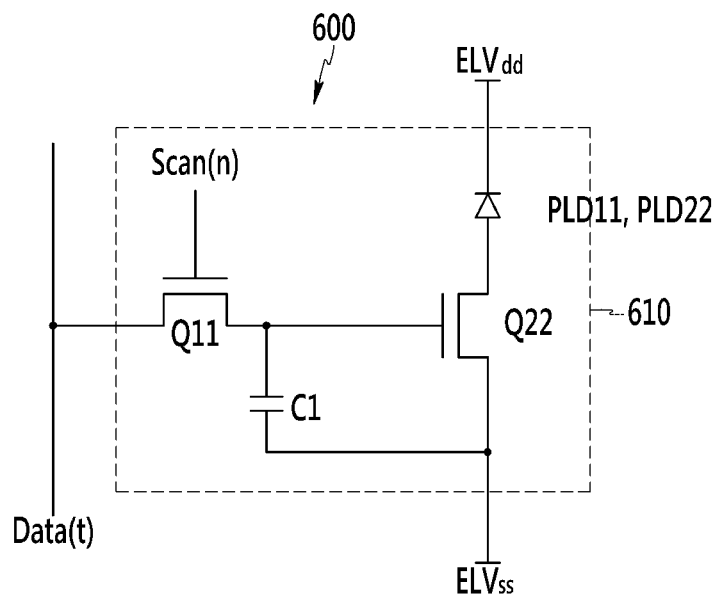
FIG. 6 is an equivalent circuit diagram of a display device pixel including photoluminescence diodes in accordance with exemplary embodiments of the invention.

FIG. 6 is an equivalent circuit diagram of a display device pixel including a photoluminescence diode in accordance with exemplary embodiments of the invention.

Each pixel 600 includes photoluminescence diodes PLD11, PLD22 and a pixel circuit 610 of a two-transistor-one-capacitor (2T1C) structure.

A gate of a first transistor Q11 is connected to a present scan signal (Scan[n]), while a first terminal of the first transistor Q11 is connected to a data signal (Data[t]), and the second terminal of the first transistor Q11 is connected to a gate of the second transistor Q22.

The gate of the second transistor Q22, which is a driving transistor, is connected to a first terminal of a capacitor C1 and to the second terminal of the first transistor Q11, while the first terminal of the second (driving) transistor Q22 is connected to the anodes of the photoluminescence diodes PLD11, PLD22 and the second terminal of the second (driving) transistor Q22 is connected to a second power source (ELVss).

The first terminal of the capacitor C1 is connected to the second terminal of the first transistor Q11 and to the gate of the second (driving) transistor Q22, and the second terminal of the capacitor C1 is connected to the second power source (ELVss).

The anodes of the photoluminescence diodes PLD11, PLD22 are connected to the first terminal of the second (driving) transistor Q22, and the cathodes of the photoluminescence diodes PLD1, PLD2 are connected to the first power source (ELVdd).

The first transistor Q11 is a switching transistor that transfers a data signal (Data[t]) of a voltage level which is applied to a corresponding data line in response to a present scan signal (Scan[n]).

The second transistor Q22 is a driving transistor that provides the photoluminescence diodes PLD11, PLD22 with a driving current according to the data signal (Data[t]) of a voltage level inputted to the gate of the second transistor Q22 through the first transistor Q11.

The capacitor C1 is a capacitor for storing a data signal applied to the gate of the second (driving) transistor Q22.

The first (switching) transistor Q11 and the second (driving) transistor Q22 are N-channel field effect transistors.

The anode terminals of the photoluminescence diodes PLD1, PLD2 are electrically connected to the first terminal of the second (driving) transistor Q22. Herein, the words "electrically connected" not only simply mean that the anode terminals of the photoluminescence diodes PLD11, PLD22 are directly connected to the first terminal of the second (driving) transistor Q22, as illustrated in FIG. 6, but also mean that, even if there is another transistor between the anode terminals of the photoluminescence diodes PLD11, PLD22 and the first terminal of the second (driving) transistor Q22, a current may flow between the anode terminals of the photoluminescence diodes PLD11, PLD22 and the first terminal of the second (driving) transistor Q2 by the operation of the other transistor.

With the structure of the pixel 600 shown in FIG. 6, the capacitor C1 applies a voltage corresponding to the data voltage (Data[t]) to the gate of the second (driving) transistor Q22, and the second (driving) transistor Q22 supplies a current corresponding to the voltage between a gate and a source to the photoluminescence diodes PLD11 PLD22

With the structure of the pixel 600 shown in FIG. 6, the swing range of the gate voltage of the second (driving) transistor Q22 needed for the operation of the light excited quenching mode may be reduced, just as in the structure of the pixel 500 shown in FIG. 5. Furthermore, since the structure of the pixel 600 shown in FIG. 6 may operate in the light excited quenching mode or the electric field excited mode according to the current supplied to the photoluminescence diodes PLD11, PLD22, it may be easily applied to a dual mode display device. During an operation in the light excited quenching mode, the voltage level of the first power source is made to be higher than the voltage level of the second power source so that a reverse bias is applied to the photoluminescence diodes PLD11, PLD22. Conversely, during an operation in the electric field excited mode, the voltage level of the first power source is made to be lower than the voltage level of the second power source so that a forward bias is applied to the photoluminescence diodes PLD11, PLD22.

Although FIGS. 5 and 6 illustrate the pixel circuits 510 and 610 of a two-transistor-one capacitor (2T1C) structure, the structure of the pixel circuits may be modified diversely so as to constitute a 2T2C structure or a 3T3C structure. In this case, the added capacitor and transistor may be introduced to solve the problem of threshold voltage deviation of the second (driving) transistors Q2 and Q22.

Figure 7:
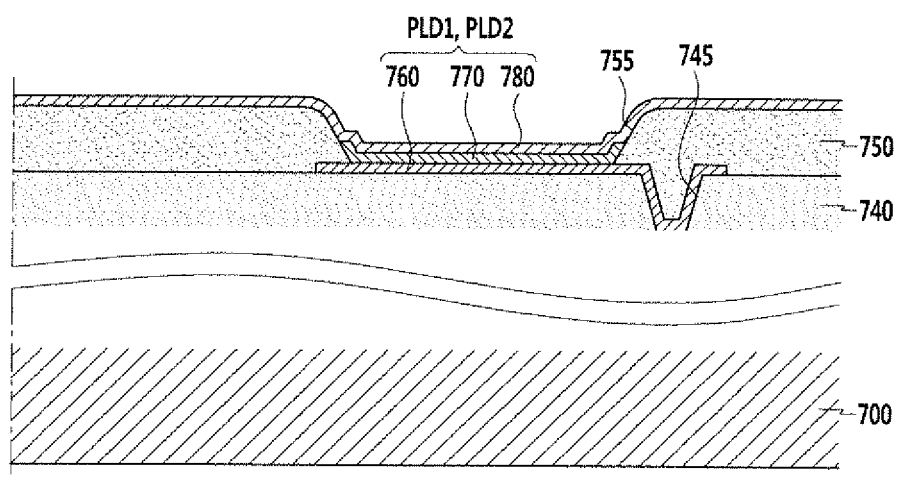
FIG. 7 is a cross-sectional view illustrating a display device including photoluminescence diodes in accordance with exemplary embodiments of the invention.

FIG. 7 is a cross-sectional view illustrating a display device including a photoluminescence diodes in accordance with exemplary embodiments of the invention.

Photoluminescence diodes PLD1, PLD2 are formed on a substrate 700. Each photoluminescence diode (PLD) includes an anode 760, an emission layer 770 including a hole injection/transport layer, an emission layer, an electron accepting layer and an electron injection layer (EIL), and a cathode 780. The anode 760 is formed on an interlayer insulating layer 740 covering a pixel circuit (see reference numerals 510 and 610 of FIGS. 5 and 6, respectively) disposed thereunder. The anode 760 may be electrically connected to the second power source ELVss (refer to FIG. 5) or to the first terminal of the second (driving) transistor Q22 (refer to FIG. 6) that is formed on the substrate 700 and covered with the interlayer insulating layer 740, the electrical connection being provided through a contact hole 745 formed in the interlayer insulating layer 740.

A pixel defining layer 750 is formed on the interlayer insulating layer 740, and a part where the pixel defining layer 750 is formed substantially becomes anon-light emitting region, and an opening 755 defined by the pixel defining layer 750 substantially becomes a light emitting region.

An emission layer 770 is formed in the interior of the opening 755 of the pixel defining layer 750, and a cathode 760 is formed to contact the emission layer 770.

The substrate 700 may be a transparent insulating substrate, such as glass, quartz, ceramic and plastics. Also, the substrate 700 may be a metallic substrate, such as stainless steel. Also, when the substrate 700 is formed of plastics, it may be a flexible substrate.

Figure 8:
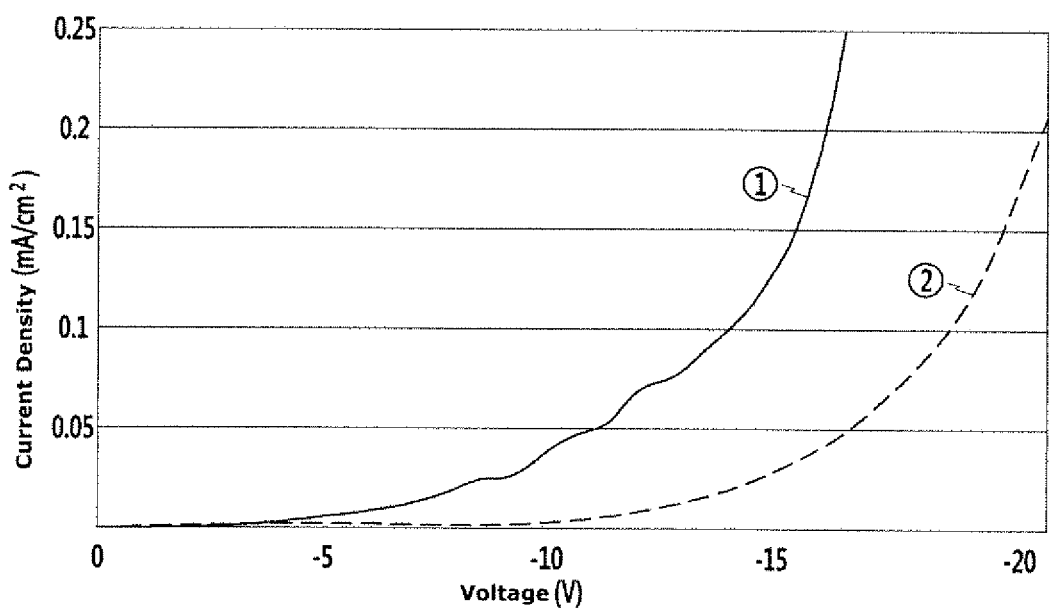
FIG. 8 is a graph illustrating the relationship between a reverse bias voltage and current density of a display device including a photoluminescence diode fabricated according to an Experimental Example and a display device including a photoluminescence diode fabricated according to a Comparative Example.

FIG. 8 is a graph illustrating the relationship between a reverse bias voltage and current density of a display device including a photoluminescence diode fabricated according to an Experimental Example and a display device including a photoluminescence diode fabricated according to a Comparative Example.

However, it will be obvious to those skilled in the art that it may be modified diversely through layout and manufacturing process designing.

The following examples illustrate this disclosure in more detail. However, the following are exemplary embodiments, and are not limiting.

A photoluminescence diode according to the Experimental Example of this disclosure was fabricated by forming an emission layer of a polymer which was prepared by mixing F8BT:TFB in a ratio of 4:1 with a thickness of about 51 nm, forming a fullerene layer with a thickness of about 2 nm, and forming a LiF layer with a thickness of about 1 nm.

Meanwhile, a photoluminescence diode according to the Comparative Example of this disclosure was fabricated by forming an emission layer of a polymer which was prepared by mixing F8BT:TFB in a ratio of 4:1 with a thickness of about 51 nm, and forming a LiF layer with a thickness of about 1 nm.

The quenching current densities of the photoluminescence diode fabricated according to the Experimental Example and the photoluminescence diode according to the Comparative Example were measured by applying a reverse bias voltage to the photoluminescence diode fabricated according to the Experimental Example and the photoluminescence diode according to the Comparative Example. The measurement results were as shown in FIG. 8. When the photoluminescent emission became almost 0 due to perfect quenching, that is, when a quenching current density was about 0.25 mA/cm², reverse bias voltage was improved about 6V from about 20V of Comparative Example (2) to about 14V of Experimental Example (1). In short, the driving voltage was reduced about 30%.

Figure 9:
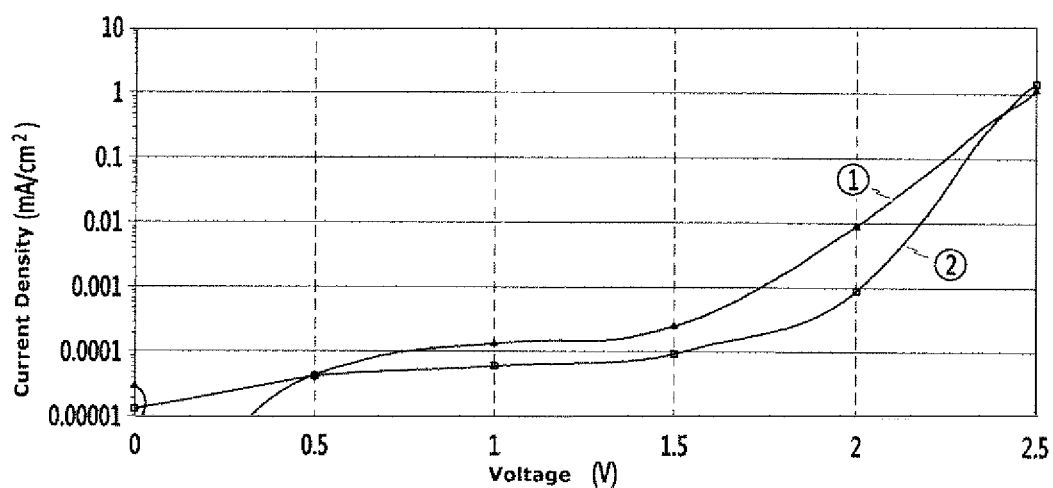
FIG. 9 is a graph illustrating the relationship between a forward bias voltage and current density of a display device including a photoluminescence diode fabricated according to an Experimental Example and a display device including a photoluminescence diode fabricated according to a Comparative Example.

FIG. 9 is a graph illustrating the relationship between a forward bias voltage and current density of a display device including a photoluminescence diode fabricated according to an Experimental Example and a display device including a photoluminescence diode fabricated according to a Comparative Example. In other words, FIG. 9 is a graph showing the relationship between forward bias voltage and current density.

It may be seen from FIG. 9 that the photoluminescence diode (C60/LiF) fabricated according to Experimental Example (1) had a lower initial implantation voltage than the photoluminescence diode (LiF) fabricated according to Comparative Example (2), and the photoluminescence diode (C60/LiF) fabricated according to Experimental Example (1) had a current amount more than 10 times higher than the photoluminescence diode (LiF) fabricated according to Comparative Example (2) at a voltage of 2V.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photoluminescence diode, comprising:
   an anode;
   a cathode;
   an emission layer interposed between the anode and the cathode;
   an electron accepting layer interposed between the emission layer and the cathode, and including one material selected from a group consisting of fullerene, methanofullerene, doped fullerene, doped methanofullerene, a derivative thereof, and a mixture thereof; and
   an electron injection layer (EIL) disposed between the electron accepting layer and the cathode,
   wherein a total thickness of the electron accepting layer and the electron injection layer (EIL) is greater than 20 Å and not greater than 200 Å.

2. The photoluminescence diode of claim 1, wherein the electron injection layer (EIL) is formed of a material selected from a group consisting of Li, Cs, Mg, LiF, CsF, $MgF_2$, NaF, KF, $BaF_2$, $CaF_2$, $Li_2O$, BaO, $Cs_2CO_3$, $Cs_2O$, CaO, MgO, and lithium quinolate.

3. The photoluminescence diode of claim 1, wherein a thickness of the emission layer is greater than 400 Å and not greater than 1000 Å.

4. The photoluminescence diode of claim 3, wherein the thickness of the emission layer is greater than 500 Å.

5. The photoluminescence diode of claim 1, wherein a thickness of the electron accepting layer is greater than 10 Å and not greater than 100 Å.

6. A photoluminescence display device comprising the photoluminescence diode of claim 5;
   said photoluminescence display device further comprising:
   a P-type first transistor for transferring a voltage-level data signal in response to a present scan signal;
   a P-type second transistor for generating a driving current of the photoluminescence diode according to the voltage-level data signal transferred by the P-type first transistor; and
   a pixel including a capacitor for storing the voltage-level data signal transferred by the P-type first transistor;
   wherein a first terminal of the P-type second transistor is connected to the cathode of the photoluminescence diode, and a second terminal of the P-type second transistor is connected to a first power source; and
   wherein the anode of the photoluminescence diode is connected to a second power source.

7. The photoluminescence display device of claim 6, wherein when the photoluminescence diode operates in a light excited quenching mode, a voltage level of the first power source is higher than a voltage level of the second power source; and
   wherein when the photoluminescence diode operates in an electric field excited mode, the voltage level of the first power source is lower than the voltage level of the second power source.

8. A photoluminescence display device, comprising the photoluminescence diode of claim 5;
   said photoluminescence display device further comprising:
   an N-type first transistor for transferring a voltage-level data signal in response to a present scan signal;
   an N-type second transistor for generating a driving current of the photoluminescence diode according to the voltage-level data signal transferred by the N-type first transistor; and
   a pixel including a capacitor for storing the voltage-level data signal transferred by the N-type first transistor,
   wherein a cathode of the photoluminescence diode is connected to a first power source; and
   wherein a first terminal of the N-type second transistor is connected to an anode of the photoluminescence diode and a second terminal of the N-type second transistor is connected to a second power source.

9. The photoluminescence display device of claim 8, wherein when the photoluminescence diode operates in a light excited quenching mode, the voltage level of the first power source is higher than the voltage level of the second power source; and
   wherein when the photoluminescence diode operates in an electric field excited mode, the voltage level of the first power source is lower than the voltage level of the second power source.

10. A photoluminescence display device comprising the photoluminescence diode of claim 4;
    said photoluminescence display device further comprising:
    a P-type first transistor for transferring a voltage-level data signal in response to a present scan signal;
    a P-type second transistor for generating a driving current of the photoluminescence diode according to the voltage-level data signal transferred by the P-type first transistor; and
    a pixel including a capacitor for storing the voltage-level data signal transferred by the P-type first transistor;
    wherein a first terminal of the P-type second transistor is connected to the cathode of the photoluminescence diode, and a second terminal of the P-type second transistor is connected to a first power source; and
    wherein the anode of the photoluminescence diode is connected to a second power source.

11. The photoluminescence display device of claim 10, wherein when the photoluminescence diode operates in a light excited quenching mode, a voltage level of the first power source is higher than a voltage level of the second power source; and
    wherein when the photoluminescence diode operates in an electric field excited mode, the voltage level of the first power source is lower than the voltage level of the second power source.

12. A photoluminescence display device, comprising the photoluminescence diode of claim 4;
    said photoluminescence display device further comprising:
    an N-type first transistor for transferring a voltage-level data signal in response to a present scan signal;

an N-type second transistor for generating a driving current of the photoluminescence diode according to the voltage-level data signal transferred by the N-type first transistor; and a pixel including a capacitor for storing the voltage-level data signal transferred by the N-type first transistor, wherein a cathode of the photoluminescence diode is connected to a first power source; and wherein a first terminal of the N-type second transistor is connected to an anode of the photoluminescence diode and a second terminal of the N-type second transistor is connected to a second power source.

13. The photoluminescence display device of claim 12, wherein when the photoluminescence diode operates in a light excited quenching mode, the voltage level of the first power source is higher than the voltage level of the second power source; and wherein when the photoluminescence diode operates in an electric field excited mode, the voltage level of the first power source is lower than the voltage level of the second power source.

14. A photoluminescence display device comprising the photoluminescence diode of claim 3;

said photoluminescence display device further comprising:

a P-type first transistor for transferring a voltage-level data signal in response to a present scan signal;

a P-type second transistor for generating a driving current of the photoluminescence diode according to the voltage-level data signal transferred by the P-type first transistor; and a pixel including a capacitor for storing the voltage-level data signal transferred by the P-type first transistor;

wherein a first terminal of the P-type second transistor is connected to the cathode of the photoluminescence diode, and a second terminal of the P-type second transistor is connected to a first power source; and wherein the anode of the photoluminescence diode is connected to a second power source.

15. The photoluminescence display device of claim 14, wherein when the photoluminescence diode operates in a light excited quenching mode, a voltage level of the first power source is higher than a voltage level of the second power source; and wherein when the photoluminescence diode operates in an electric field excited mode, the voltage level of the first power source is lower than the voltage level of the second power source.

16. A photoluminescence display device, comprising the photoluminescence diode of claim 3;

said photoluminescence display device further comprising:

an N-type first transistor for transferring a voltage-level data signal in response to a present scan signal;

an N-type second transistor for generating a driving current of the photoluminescence diode according to the voltage-level data signal transferred by the N-type first transistor; and a pixel including a capacitor for storing the voltage-level data signal transferred by the N-type first transistor, wherein a cathode of the photoluminescence diode is connected to a first power source; and wherein a first terminal of the N-type second transistor is connected to an anode of the photoluminescence diode and a second terminal of the N-type second transistor is connected to a second power source.

17. The photoluminescence display device of claim 16, wherein when the photoluminescence diode operates in a light excited quenching mode, the voltage level of the first power source is higher than the voltage level of the second power source; and wherein when the photoluminescence diode operates in an electric field excited mode, the voltage level of the first power source is lower than the voltage level of the second power source.

18. A photoluminescence display device comprising the photoluminescence diode of claim 2;

said photoluminescence display device further comprising:

a P-type first transistor for transferring a voltage-level data signal in response to a present scan signal;

a P-type second transistor for generating a driving current of the photoluminescence diode according to the voltage-level data signal transferred by the P-type first transistor; and a pixel including a capacitor for storing the voltage-level data signal transferred by the P-type first transistor;

wherein a first terminal of the P-type second transistor is connected to the cathode of the photoluminescence diode, and a second terminal of the P-type second transistor is connected to a first power source; and wherein the anode of the photoluminescence diode is connected to a second power source.

19. The photoluminescence display device of claim 18, wherein when the photoluminescence diode operates in a light excited quenching mode, a voltage level of the first power source is higher than a voltage level of the second power source; and wherein when the photoluminescence diode operates in an electric field excited mode, the voltage level of the first power source is lower than the voltage level of the second power source.

20. A photoluminescence display device, comprising the photoluminescence diode of claim 2;

said photoluminescence display device further comprising:

an N-type first transistor for transferring a voltage-level data signal in response to a present scan signal;

an N-type second transistor for generating a driving current of the photoluminescence diode according to the voltage-level data signal transferred by the N-type first transistor; and a pixel including a capacitor for storing the voltage-level data signal transferred by the N-type first transistor, wherein a cathode of the photoluminescence diode is connected to a first power source; and wherein a first terminal of the N-type second transistor is connected to an anode of the photoluminescence diode and a second terminal of the N-type second transistor is connected to a second power source.

21. The photoluminescence display device of claim 20, wherein when the photoluminescence diode operates in a light excited quenching mode, the voltage level of the first power source is higher than the voltage level of the second power source; and wherein when the photoluminescence diode operates in an electric field excited mode, the voltage level of the first power source is lower than the voltage level of the second power source.

22. A photoluminescence display device comprising the photoluminescence diode of claim 1;

said photoluminescence display device further comprising:

a P-type first transistor for transferring a voltage-level data signal in response to a present scan signal;

a P-type second transistor for generating a driving current of the photoluminescence diode according to the voltage-level data signal transferred by the P-type first transistor; and a pixel including a capacitor for storing the voltage-level data signal transferred by the P-type first transistor;

wherein a first terminal of the P-type second transistor is connected to the cathode of the photoluminescence diode, and a second terminal of the P-type second transistor is connected to a first power source; and wherein the anode of the photoluminescence diode is connected to a second power source.

23. The photoluminescence display device of claim 22, wherein when the photoluminescence diode operates in a light excited quenching mode, a voltage level of the first power source is higher than a voltage level of the second power source; and wherein when the photoluminescence diode operates in an electric field excited mode, the voltage level of the first power source is lower than the voltage level of the second power source.

24. A photoluminescence display device, comprising the photoluminescence diode of claim 1; said photoluminescence display device further comprising:

an N-type first transistor for transferring a voltage-level data signal in response to a present scan signal;

an N-type second transistor for generating a driving current of the photoluminescence diode according to the voltage-level data signal transferred by the N-type first transistor; and a pixel including a capacitor for storing the voltage-level data signal transferred by the N-type first transistor, wherein a cathode of the photoluminescence diode is connected to a first power source; and wherein a first terminal of the N-type second transistor is connected to an anode of the photoluminescence diode and a second terminal of the N-type second transistor is connected to a second power source.

25. The photoluminescence display device of claim 24, wherein when the photoluminescence diode operates in a light excited quenching mode, the voltage level of the first power source is higher than the voltage level of the second power source; and wherein when the photoluminescence diode operates in an electric field excited mode, the voltage level of the first power source is lower than the voltage level of the second power source.

* * * * *